(12) United States Patent
Griffith

(10) Patent No.: US 9,204,564 B1
(45) Date of Patent: Dec. 1, 2015

(54) SECURE ENCLOSURE FOR PREVENTING ACCESS TO CRITICAL EQUIPMENT MOUNTED IN AN OPEN TWO-POST TELECOM RACK

(71) Applicant: Robert Jon Griffith, Goodyear, AZ (US)

(72) Inventor: Robert Jon Griffith, Goodyear, AZ (US)

( * ) Notice: Subject to any disclaimer, the term of this patent is extended or adjusted under 35 U.S.C. 154(b) by 23 days.

(21) Appl. No.: 13/921,176

(22) Filed: Jun. 18, 2013

(51) Int. Cl.
*H02B 1/06* (2006.01)
*H05K 5/02* (2006.01)
*A47B 81/00* (2006.01)
*H02G 3/08* (2006.01)

(52) U.S. Cl.
CPC .............. *H05K 5/0208* (2013.01); *A47B 81/00* (2013.01); *H02B 1/066* (2013.01); *H02G 3/088* (2013.01)

(58) Field of Classification Search
CPC ........... A47B 47/03; A47B 2088/0403; A47B 81/00; H05K 5/0208; H02G 3/081; H02G 3/086; H02G 3/088; H02G 3/14; H02B 1/06; H02B 1/066

USPC .............. 312/257.1, 283, 285, 286, 326, 329; 174/50

See application file for complete search history.

(56) References Cited

U.S. PATENT DOCUMENTS

| 3,807,826 A * | 4/1974 | Peckenpaugh ................ 312/305 |
| 5,232,277 A * | 8/1993 | Cassady et al. ............... 312/296 |
| 6,005,188 A * | 12/1999 | Teichler et al. ................. 174/50 |
| 6,213,577 B1 * | 4/2001 | Rooyakkers et al. ...... 312/265.3 |
| 2003/0205953 A1 * | 11/2003 | Fox ............................... 312/216 |
| 2012/0086314 A1 * | 4/2012 | Bourke et al. ................ 312/109 |

* cited by examiner

*Primary Examiner* — James O Hansen
(74) *Attorney, Agent, or Firm* — Thomas W. Galvani, P.C.; Thomas W. Galvani

(57) ABSTRACT

A secure enclosure prevents access to both the front and rear of the rack mounted equipment through the use of fabricated sheet metal enclosures with hinged access covers, uniquely attached to the rack faces from the inside. Access is granted to a front swing cover only by presenting proper credentials typically in the form of a card key to an electronic card reader which opens the electronic latch or strike. A back swing cover panel is secured from the inside with a latch and can be opened after gaining proper access through the front.

5 Claims, 6 Drawing Sheets

SECURE ENCLOSURE FOR PREVENTING ACCESS TO CRITICAL EQUIPMENT MOUNTED IN AN OPEN TWO-POST TELECOM RACK

BACKGROUND OF THE INVENTION

The present invention relates to the field of rack mounted equipment security.

Nothing currently exists in the field that provides for access restriction and functionality for equipment mounted in an open 19" telecom rack.

Most know installations, with the exception of raised-floor applications, do not have the space or budget for a full-sized network cabinet which are primarily designed for large four-point mounted equipment or already have open racks installed. Add-on boxes are too deep and do not mount properly or provide the proper functionality.

Any solution involving someone's discretion is unreliable. Any other physical solution is either too expensive and or lacks in functionality.

SUMMARY OF THE INVENTION

The present invention solves the problem of restricting access to critical rack-mounted control equipment and devices in an open 19" telecom radio rack.

The primary use of the enclosure of the present invention is to prevent casual physical access to critical operational equipment in the commercial and regulatory arenas. This equipment today is typically rack-mounted in an open telecom radio rack which left unsecured, presents the possibility for unauthorized operation or damage to critical operating systems and Cyber Assets. This enclosure ensures that equipment is not tampered with and is properly accessed only by authorized, credentialed personnel. Integrating the enclosure with access control also logs user history.

The present invention prevents access to both the front and rear of the rack mounted equipment through the use of fabricated sheet metal enclosures with hinged access covers, uniquely attached to the rack faces from the inside. Access is granted to the front only by presenting proper credentials typically in the form of a card key to an electronic card reader which opens the electronic latch or strike. The rear hinged access panel is secured from the inside with a latch and can be opened after gaining proper access through the front.

The present invention is also unique in having a cover which does not add to the width of the rack nor does it restrict or encroach on the full mounting surface, front and back nor does it interfere with any equipment mounted in any adjacent rack.

DETAILED DESCRIPTION OF THE INVENTION

Figure 1:
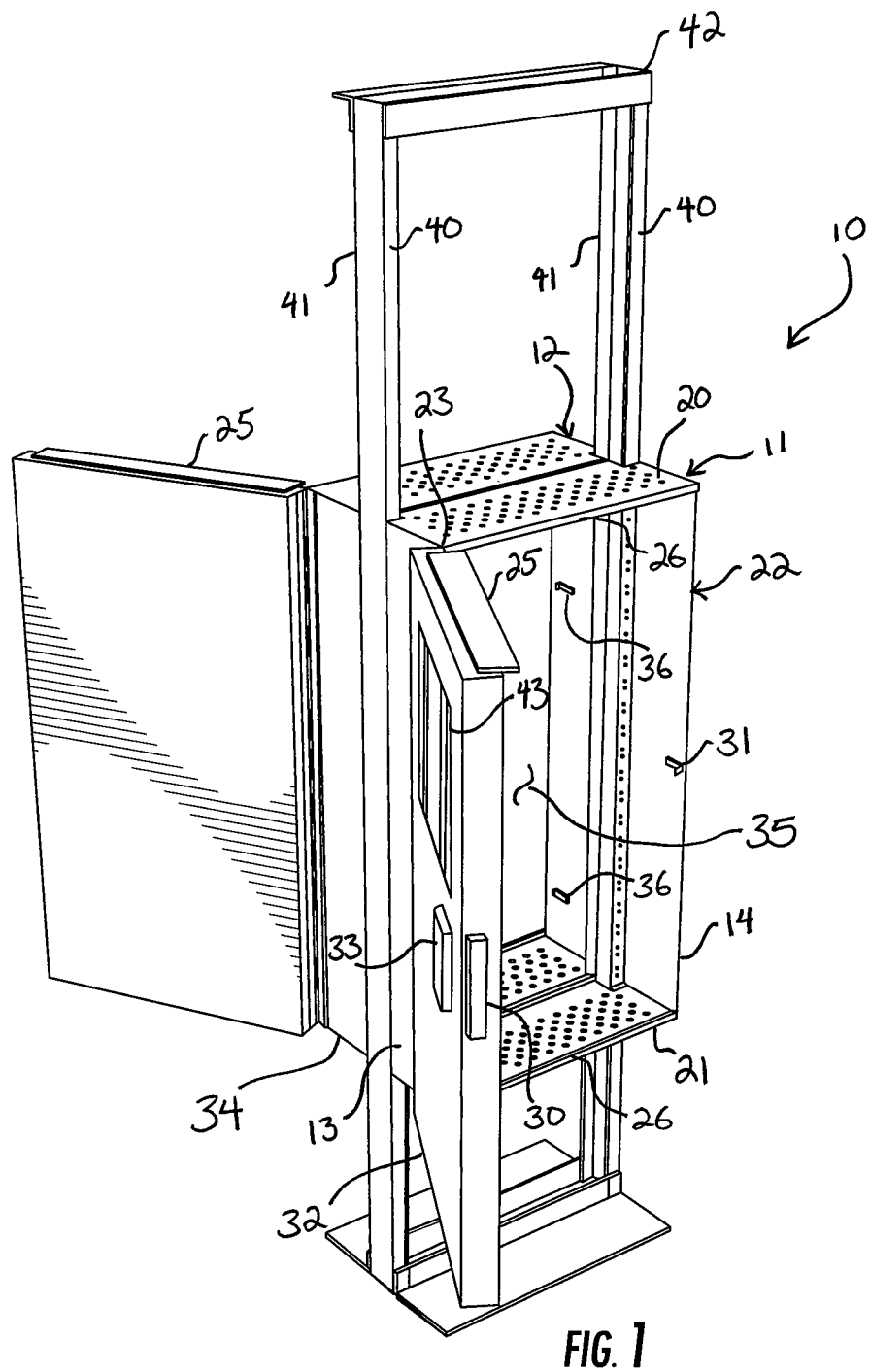
FIG. 1 illustrates an enclosure according to an exemplary embodiment of the present invention with front and back swing covers in open positions.
Figure 2:
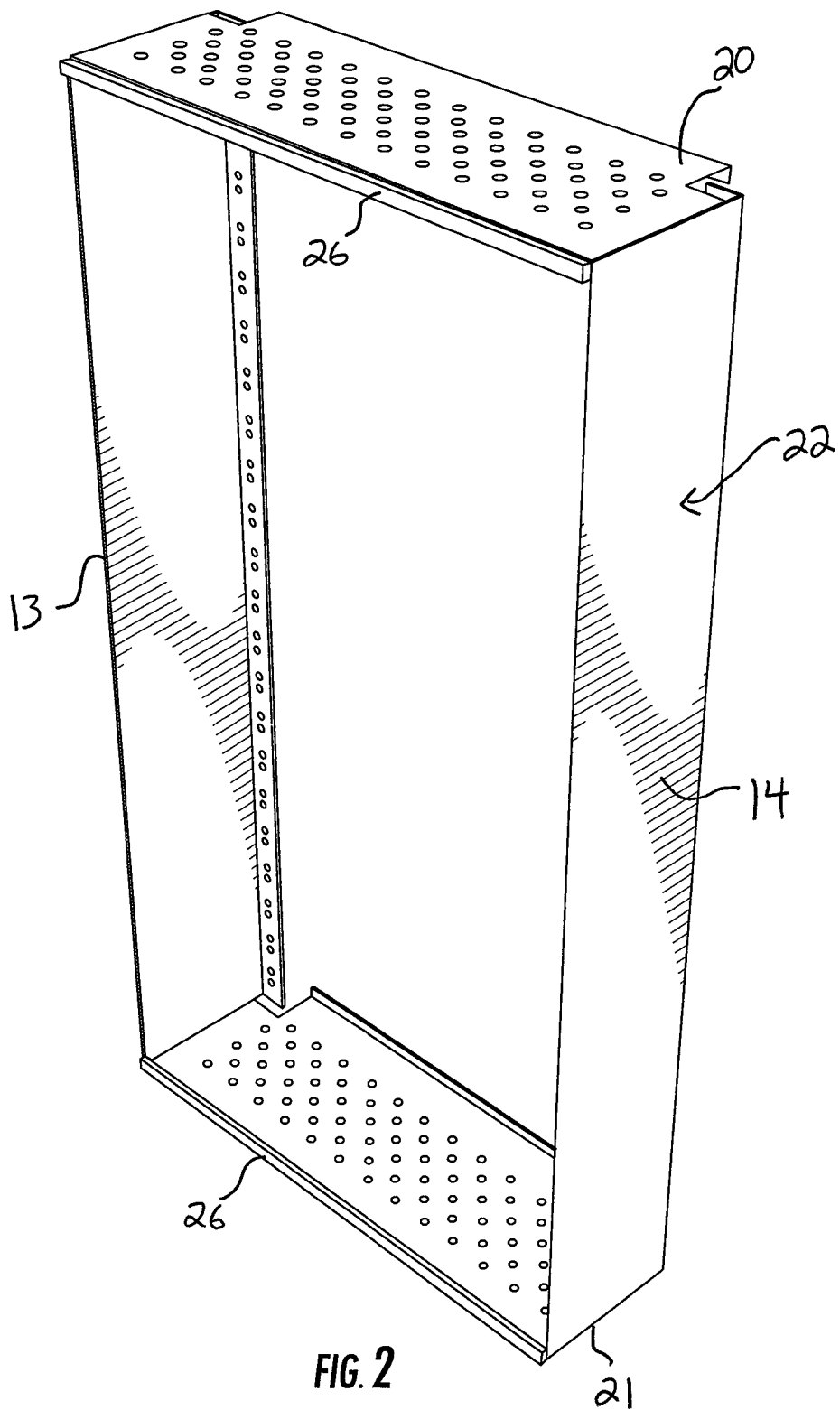
FIG. 2 illustrates a back or front half according to an exemplary embodiment of the enclosure of the present invention.
Figure 3:
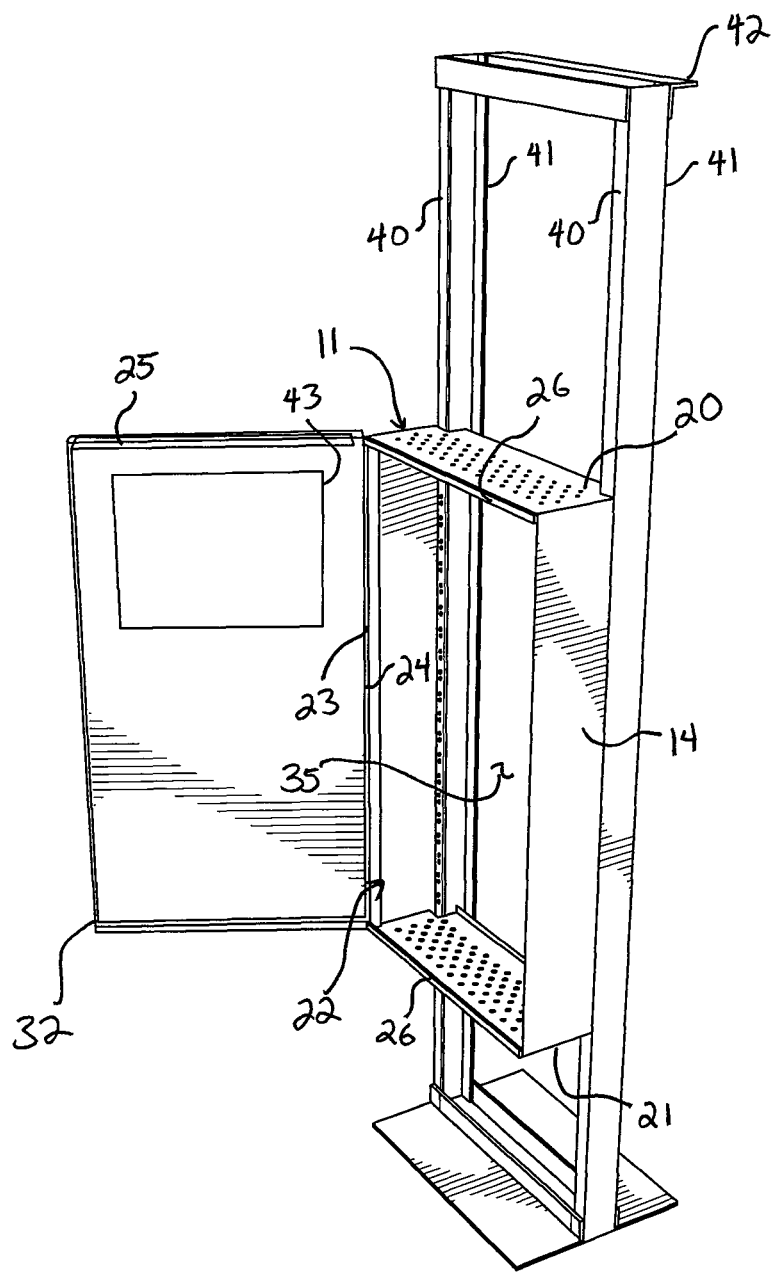
FIG. 3 illustrates a front half with open front swing cover according to an exemplary embodiment of the enclosure of the present invention.
Figure 4:
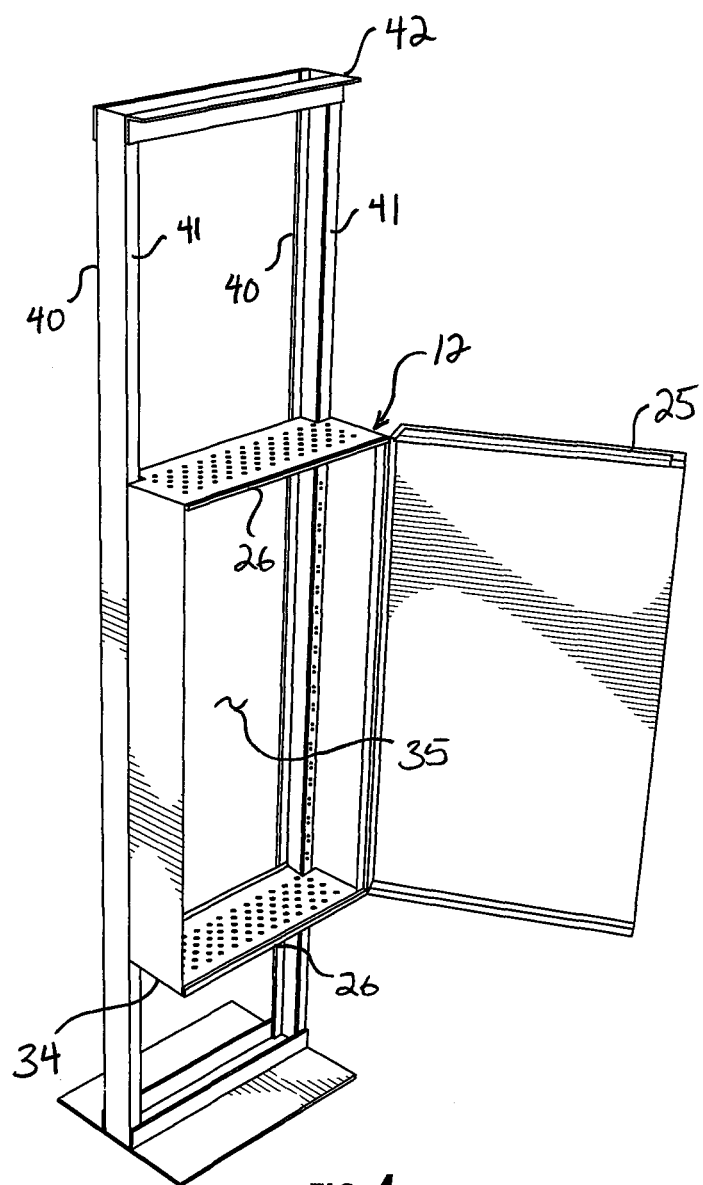
FIG. 4 illustrates a back half with open back swing cover according to an exemplary embodiment of the enclosure of the present invention.
Figure 5:
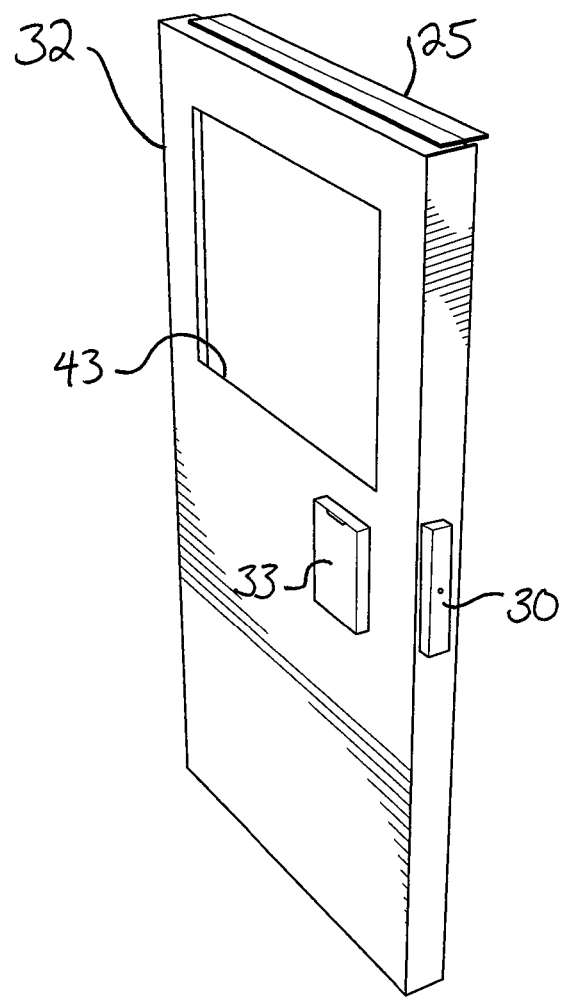
FIG. 5 illustrates a front swing cover according to an exemplary embodiment of the enclosure of the present invention.
Figure 6:
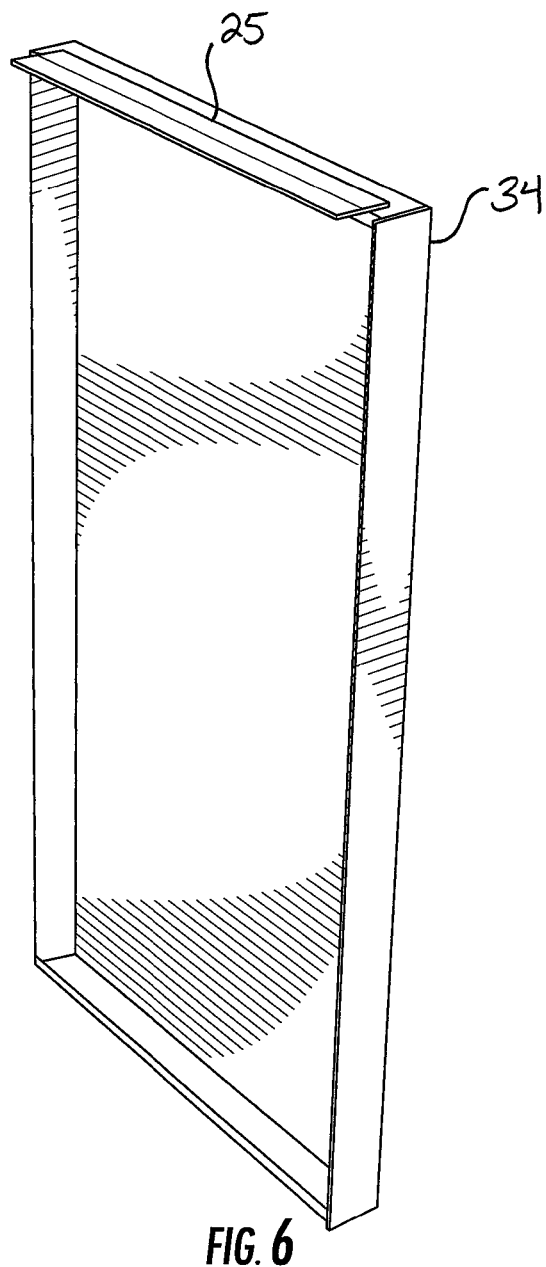
FIG. 6 illustrates a rear swing cover according to an exemplary embodiment of the enclosure of the present invention.

The enclosure 10 is made in front and back halves 11 and 12 as illustrated in FIGS. 1, 3 and 4.

The front half 11 is composed of left side 13 and right side 14, welded to top panel 20 and bottom panel 21 forming an open four-sided box 22. A hinge 23 is spot welded to left side 13 leading edge and front swing cover left edge 24. Seals 26 are affixed to front edges of top and bottom panels 20 and 21. A cover alignment guide 25 is welded to front and rear swing cover top edges. A lock 30 is mounted to inside right surface of front right side 14 to engage with a lock strike 31 mounted to inside right face of front cover 32. A card reader 33 is mounted to front cover 32 on an inside surface.

The back half is identical to front half except without lock, strike or reader. A back cover 34 is secured by draw latches 36 welded to inside of back left side.

Front and back assembled covers are attached to the front and back faces 40 and 41 of an open 19" telecom radio rack 42 with rack screws from the inside directly opposite each other. The back cover 34 is secured by the latches also from the inside 35.

When both halves 11 and 12 are installed and secured, unauthorized access to critical equipment mounted in the previously open telecom rack 42 is prevented. However, personnel with proper credentials can open the front cover 32 to access equipment operation, installation and removal and the back swing cover 34 from the inside 35 to access equipment cabling from the rear. The secure covers 32 and 34 do not exceed the overall width of the rack 42 nor do they interfere with the installation, removal and mounting of equipment in the 17.5" clear mounting space.

How to Make the Invention:

The main front and back enclosure components (left, right, top and bottom panels 13, 14, 20, and 21) are fabricated (parted and formed) from sheet steel and welded into four-sided open box assemblies. The fabricated sheet steel front and rear covers 32 and 34 are spot welded to the continuous hinges 23 which are in turn spot welded to the left side sheet steel front and back edges; creating the front and back swing covers 32 and 34. The latch catch of the back half 12 are welded in place and the assembly is cleaned, primed and powder coated with a textured light spatter pattern. The front and back enclosures then receive the edge seals and the front enclosure receives the lock 30 mechanism, card reader 33 and, optionally, the viewing window 43.

All elements are necessary for proper functionality except for the optional viewing window 43 of the front swing cover 32. There may be options on the type and position of the electronic lock 30 as well. Some locks have key overrides and some do not.

The mounting configuration is unique but, in some embodiments, covers 32 and 34 might be mechanically fastened instead of hinged. However, this may limit the functionality and convenience of use of the assembly.

In some embodiments, the cover/assembly 32 and 34 may be hinged from an alternate position but would not be ideal.

A variety of lock types may be used but could diminish the effectiveness of restricted access unless a lesser degree of restriction is required.

Materials other than metal might be used but are easily compromised.

The present invention can be made in various sizes to accommodate any practical amount of equipment i.e. 12RU, 24RU, 36RU and 48RU (for reference, a single rack unit (RU) is 1.75"). Depth variations could also be considered to accommodate larger equipment if necessary.

While described as being for use generally in the telecom field, the present invention can be used in any field where some level of physical security is desired. Examples would be Government, Health Care, Educational Facilities, Military, Regulatory and general Industry (Electric Utilities and Power Plants). The enclosure has the flexibility to fit any access level requirement from no restriction (using a simple mechanical latch) to full access control protection with multiple forms of authentication.

While the invention has been described with respect to certain specific embodiments, it will be appreciated that many modifications and changes may be made by those skilled in the art without departing from the spirit of the invention. It is intended, therefore, by the appended claim to cover all such modifications and changes as fall within the true spirit and scope of the invention.

What is claimed is:

1. Apparatus comprising:
an open telecom rack having left and right posts each with front faces;
an enclosure mounted in the telecom rack, wherein the enclosure comprises:
front and back halves comprising left, right, top and bottom panels;
wherein each of said left and right panels further comprises a short top edge, a short bottom edge, a long front edge and a long back edge; and
wherein each of said top and bottom panels comprises a short left edge, a short right edge, a long front edge and a long back edge;
wherein respective short edges of said left and right sides and said top and bottom panels are joined together to form an open, four-sided box bounding an interior and including an open back;
the long back edges of each of the left and right panels are turned inwardly to form flanges extending into the interior, the long back edges of the top and bottom panels each extend further away from the front edges than do the long back edges of each of the left and right panels;
notches are formed between the left panel and the top panel, between the left panel and the bottom panel, between the right panel and the top panel, and between the right panel and the bottom panel, each notch extends into the interior of the enclosure and is sized to receive one of the left and right posts of the open telecom rack;
said top and bottom panels formed with perforations;
front and back swing covers each having left, right, top and bottom edges;
front and back hinges spot welded to said long front and back edges, respectively, of said left panel of said front and back halves, respectively, and to said left edge of said front and back swing covers, respectively;
a plurality of front and back seals affixed to the long front and back edges, respectively, of said top and bottom panels of said front and back halves, respectively;
a front swing cover alignment guide welded to said top edge of said front swing cover;
a lock strike mounted to an inside face of said front swing cover near said right edge of said front swing cover;
a card reader mounted to an outside surface of said front swing cover for signaling said lock to disengage from said lock strike upon insertion of an authorized card;
a plurality of latches mounted to an inside face of said right panel of said back half; and
the left and right panels are flush with the left and right rack posts received in the notches, and the left and right rack posts are in contact with and flush against the flanges, respectively.

2. The apparatus of claim 1, wherein the front face of each rack post is available within the interior of the box between the left and right panels for use.

3. The apparatus of claim 1, wherein the front face of each post is accessible from within the interior of the box.

4. The apparatus of claim 1, further comprising a window formed in the front swing cover.

5. The apparatus of claim 1, wherein the front swing cover alignment guide is an elongate plate overhanging from the top edge of the front swing cover and extending rearwardly toward the front half.

* * * * *